United States Patent [19]

Lee et al.

[11] Patent Number: 5,497,037
[45] Date of Patent: Mar. 5, 1996

[54] METHOD AND APPARATUS FOR DECOUPLING OF UNUSED POWER SUPPLY PINS OF A PRINTED CIRCUIT BOARD CAPABLE OF OPERATING AT A PLURALITY OF PREDETERMINED VOLTAGES

[75] Inventors: Sherman Lee, Rancho Palos Verde; Mark Mah, San Jose, both of Calif.

[73] Assignee: Advanced Micro Devices, Inc., Sunnyvale, Calif.

[21] Appl. No.: 274,871

[22] Filed: Jul. 14, 1994

[51] Int. Cl.$^6$ .................................. H05K 1/16
[52] U.S. Cl. .................. 307/42; 361/792; 361/794; 361/795; 29/829
[58] Field of Search ................ 307/42; 361/792, 361/794, 795; 28/829

[56] References Cited

U.S. PATENT DOCUMENTS 5,272,600  12/1993  Carey ................... 361/792
5,307,241  4/1994  Pistilli ................... 361/784
5,428,506  6/1995  Brown et al. ........... 361/794

*Primary Examiner*—William M. Shoop, Jr.
*Assistant Examiner*—Albert Paladini
*Attorney, Agent, or Firm*—Benman Collins & Sawyer

[57] ABSTRACT

A printed circuit board (PCB) capable of operating at first and second predetermined voltage levels including a plurality of metal layers, one of the metal layers being divided to provide two electrically isolated sections, the two electrically isolated sections being on substantially the same plane; one of the electrically isolated sections being associated with the first predetermined voltage level and the other of the electrically isolated sections being associated with the second predetermined voltage level. The PCB includes a first plurality of signal pins coupled to the one of the electrically isolated sections. The PCB also includes at least one capacitor coupled to a ground plane, the first plurality of signal pins and the one of the electrically isolated metal sections, wherein an alternating current path is provided. The PCB in a preferred embodiment is an expansion board utilized in a personal computer.

19 Claims, 4 Drawing Sheets

METHOD AND APPARATUS FOR DECOUPLING OF UNUSED POWER SUPPLY PINS OF A PRINTED CIRCUIT BOARD CAPABLE OF OPERATING AT A PLURALITY OF PREDETERMINED VOLTAGES

FIELD OF THE INVENTION

The present invention is directed toward printed circuit boards and more particularly is directed toward printed circuit boards capable of operating at multiple supply voltage levels.

BACKGROUND OF THE INVENTION

As integrated circuit technology migrates to lower and lower voltages, there is a need to provide a plurality of power supply pins on a printed circuit board (PCB) such that a variety of voltages can be applied thereto. For example in a personal computer, a printed circuit board, typically referred to as an expansion board is plugged into a connector in the motherboard of the personal computer. More particularly, for example, the Peripheral Component Interface (PCI) standard utilized in such computers provides for both 5 volt and 3.3 volt signaling environments.

One goal of such a standard is to provide a quick and easy transition from one process technology to another. In order to facilitate such a transition, the standard defines two expansion board connectors, one for the 5 volt signaling environment, and one for the 3.3 volt signaling environment. This allows for either voltages to be used on this particular type of component.

In the 5 volt signaling environment, all the 3.3 volt and any unused 5 volt pins need to be coupled to the ground plane, to ensure they continue to function as efficient signal return paths. In such a system, all power planes must be decoupled to ground in such a way to provide for reasonable management of the switching currents to which the planes and the supply paths are subjected. Accordingly in such a system, the 3.3 volt pins, even if they are not delivering power, must provide an alternating current return path and must be bussed together on the motherboard preferably on a separate power plane and decoupled to ground in a manner consistent with high speed signaling techniques.

One of the problems associated with the transition of using multiple voltages on a single expansion board utilizing a standard such as described above is that to ensure an adequate return path, there typically must be a plurality of high speed capacitors on the expansion board. The most obvious way to attempt to address this problem is to place the plurality of capacitors and the supply on the expansion board directly on the 3.3 volt plane, thereby ensuring that the specifications are met. However, the problem with this solution is that as the PCB becomes smaller and smaller these capacitors are harder to place on the PCB. Accordingly, placing a large number of capacitors would increase the manufacturability and cost of the PCB significantly.

One approach to solving this problem would be to place the capacitors on the underside of the circuit board, that is, on the side away from where the rest of the components are placed. This approach would add significantly to the overall manufacturing costs of the PCB.

Another approach to solving this problem would be to build the PCB with two additional signal layers. The additional layers would provide extra routing for signal paths blocked by the large number of capacitors. Again, this approach would add significantly to the manufacturing cost of the PCB.

Accordingly, what is needed is a system of ensuring that the interconnections associated with providing adequate return path in the above-identified situation is resolved in a cost effective manner. More particularly, what is needed is a method and system for decoupling of unused 3.3 volt supply pins, for example in a PCI standard on an expansion board, and providing a return path therefore without adding significant cost and expense to the expansion board.

The present invention addresses such a need.

SUMMARY OF THE INVENTION

A printed circuit board (PCB) is disclosed that is capable of operating at multiple supply voltage levels and is capable of decoupling unused supply pins to provide an alternating current return path.

In a first aspect of the present invention, a PCB capable of operating at first and second predetermined voltage levels is disclosed. The PCB comprises a plurality of metal layers, one of the metal layers being divided to provide two electrically isolated sections, the two electrically isolated sections being on substantially the same plane; one of the electrically isolated sections being associated with the first predetermined voltage level and the other of the electrically isolated sections being associated with the second predetermined voltage level. The PCB includes a first plurality of signal pins coupled to the one of the electrically isolated sections. The PCB also includes at least one capacitor coupled to a ground plane, the first plurality of signal pins and the one of the electrically isolated metal sections, wherein an alternating current path is provided.

In another aspect of the present invention, in a PCB capable of operating at first and second predetermined voltages, the PCB includes a plurality of layers, the PCB also includes a first and second plurality of signal pins for operation of the first and second predetermined voltages. A method is disclosed for decoupling the first plurality of signal pins when the PCB is operating at the second predetermined voltage. The system comprises dividing one of the plurality of metal layers such that there is provided two electrically isolated metal layers on substantially the same plane, one of the electrically isolated metal layers being associated with the first plurality of signal pins; the other of the electrically isolated metal layers being associated with the second plurality of pins, and coupling at least one capacitor to a ground layer, the one of the electrically isolated metal layer and the first plurality of signal pins to provide an alternating current return path.

DETAILED DESCRIPTION OF THE DRAWINGS

The present invention is an improved printed circuit board (PCB) and method and system for providing the same. The following description is presented to enable one of ordinary skill in the art to make and use the invention and is presented in the context of a particular application and its requirements. Various modifications to the preferred embodiment will be readily apparent to those of ordinary skill in the art and the generic principles defined herein may be applied to other embodiments and applications without departing from the spirit and scope of the present invention. Thus the present invention is not to be limited to the embodiment shown, but is to be accorded with the widest scope consistent with the principles and features disclosed herein.

Figure 1:
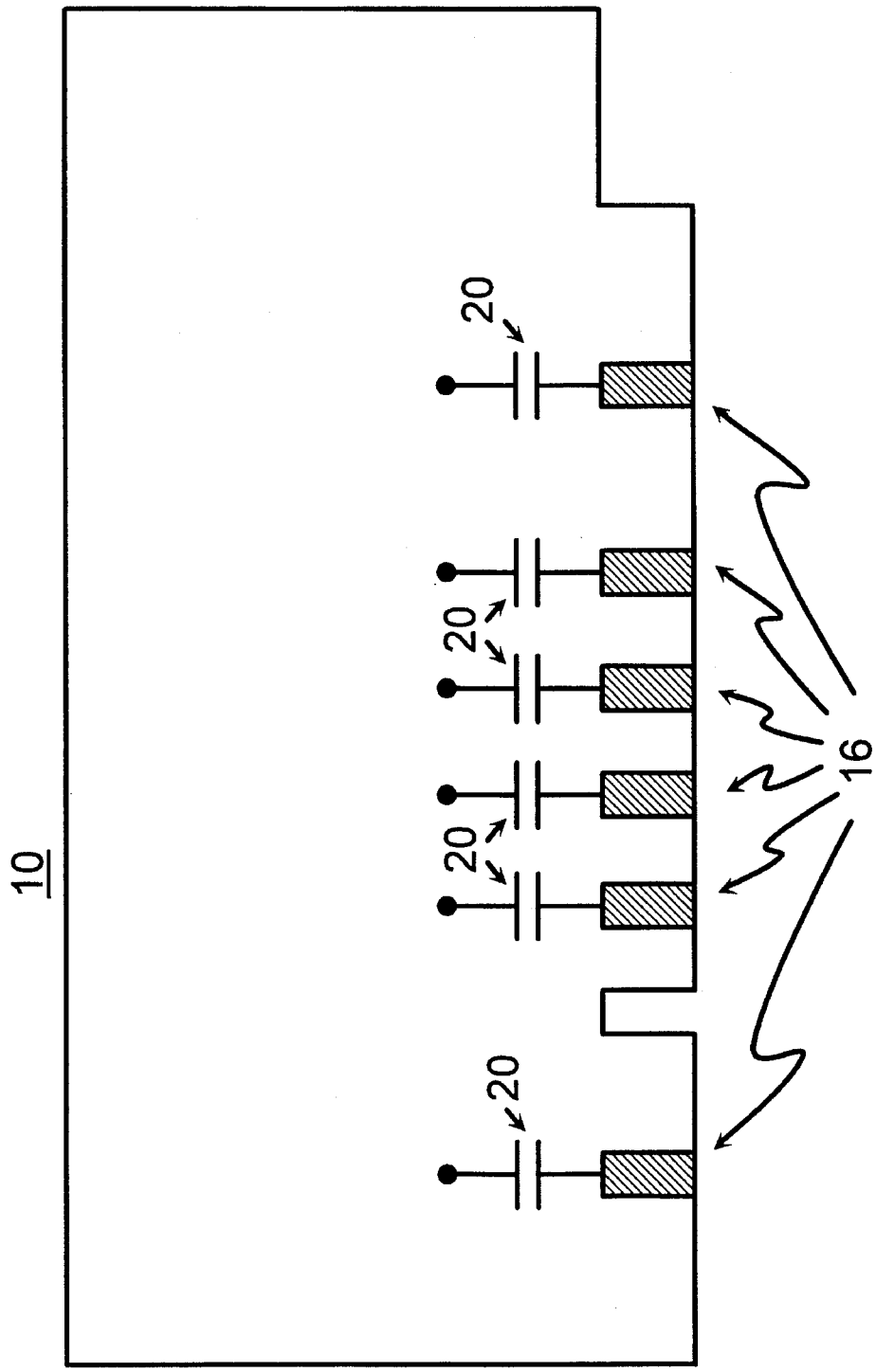
FIG. 1 shows a simplified diagram of a prior art printed circuit board (PCB).
Figure 2:
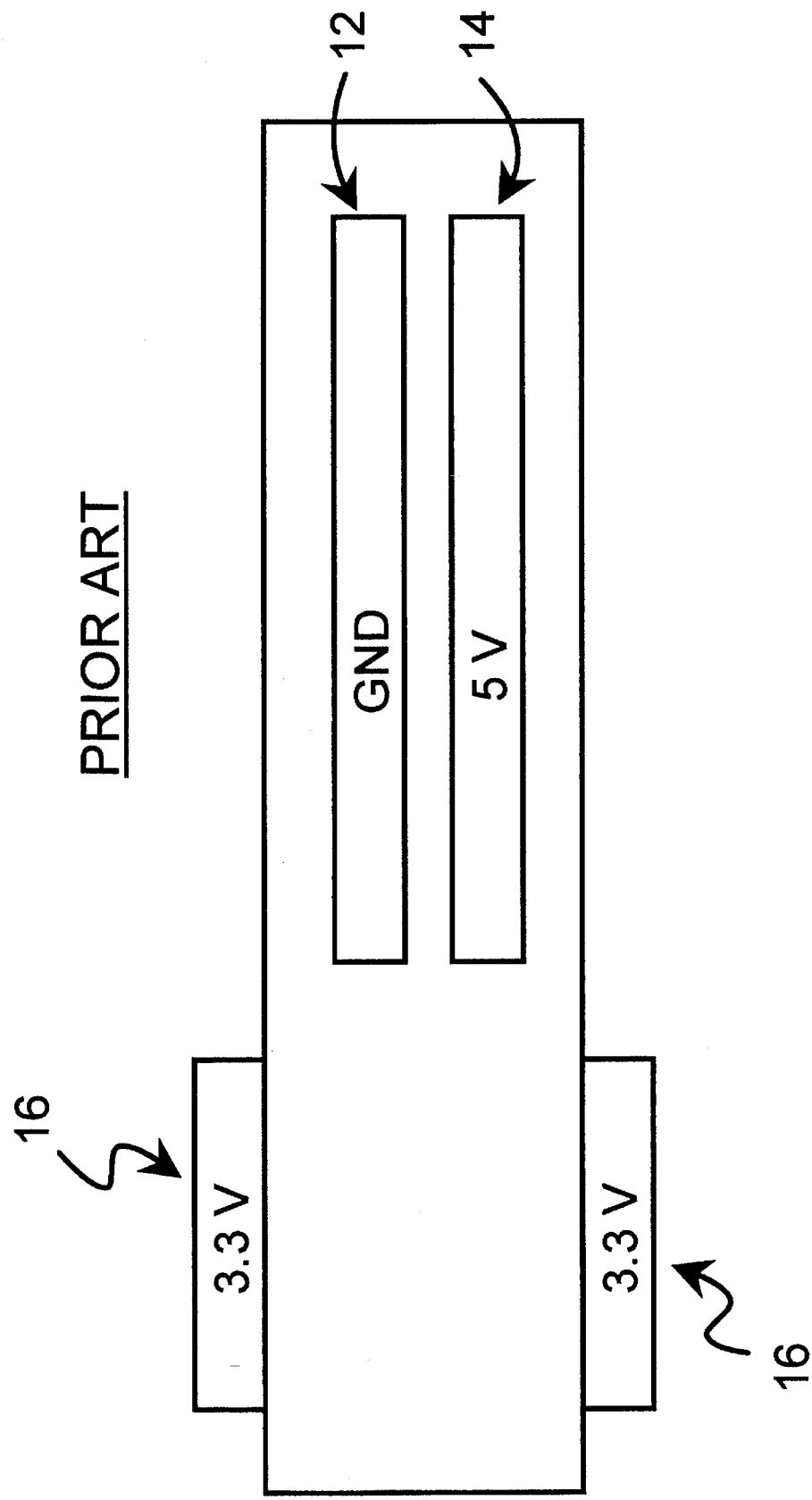
FIG. 2 shows an exploded view of a prior art PCB of FIG. 1.

Referring now to FIG. 1, what is shown is a simplified block representation of the top of a conventional printed circuit board (PCB) 10. As is well known, this type of PCB 10 would include multiple layers, shown in exploded view in FIG. 2.

Typically these layers would include a metal layer 12 for the ground connections, a metal layer 14 for the power supply voltage of a first predetermined level in the case of the Peripheral Component Interface (PCI) standard, 5 volts, and signal pins 16 for the power supply voltage at a second predetermined level in the case of the PCI standard 3.3 volts. It should be understood by one of ordinary skill in the art that although there may be other layers associated with the PCB that are necessary for the proper operation of the PCB, these layers are described to better illustrate the present invention. To ensure that signal pins 16 adjacent to other signal pins 16 are provided with reasonable management of switching currents, all of the signal pins 16 must provide an alternating current (AC) return path.

Referring back to FIG. 1, a plurality of capacitors 20 are coupled from the metal layer 12 or 14 to a plurality of signal pins 16. As is seen in this embodiment, each of the capacitors 20 are coupled from the metal layer 14 to the signal pins 16. It has been found that the signal pins 16 (i.e. 3.3 volts in the PCI standard) must be decoupled to AC ground (AC ground can be 5 volts or ground) during higher voltage operation (i.e. 5 volts in the PCI standard) in a manner consistent with high speed signaling techniques.

Accordingly, for an expansion board in a PCI application, the 3.3 volt signal pins 16 have the following constraints:

1. The decoupling must average at least 0.01 µF (high-speed) per signal pin 16.
2. The trace length from signal pin 16 pad to capacitor 20 pad shall be no greater than 0.25 inches, using a trace width of at least 0.02 inches.
3. There is no limit to the number of signal pins 16 that can share the same capacitor 20, provided that requirements 1 and 2 are met.

By coupling the capacitors 20 to the signal pins 16 in the manner described in PCB 10, several problems are encountered. Firstly, the number of capacitors 20 required would significantly increase the size of the PCB 10. Secondly, those additional capacitors 20 increase the cost of manufacturing the PCB 10. Finally, the arrangement of the PCB 10 would also require additional metal layers to accommodate the interconnections among the capacitors 20 which in turn would increase the cost of the PCB 10.

Accordingly, for the above-mentioned reasons, an alternative to the conventional PCB 10 is needed to provide a more cost effective PCB 10 when multiple supply voltage levels are provided to the PCB 10. This is particularly important when constraints are placed upon the operation of the PCB 10 as has been described above in connection to the PCI standard.

Figure 3:
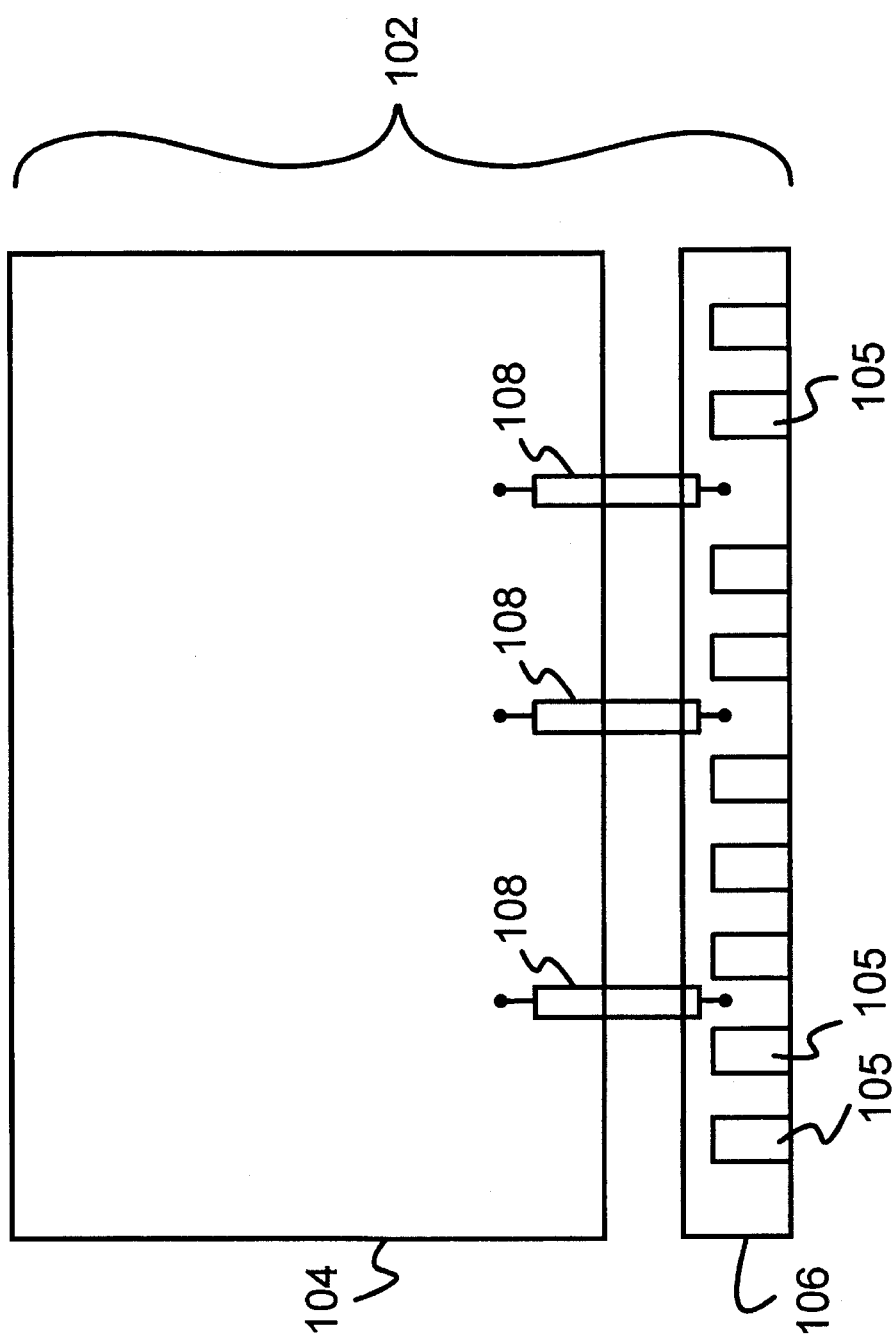
FIG. 3 shows a simplified diagram of a PCB in accordance with the present invention.

Referring now to FIG. 3, what is shown is a simplified diagram of a PCB 100 in accordance with the present invention. In the PCB 100, a metal layer 102 is divided into two electrically isolated metal sections 104 and 106. Accordingly, the metal sections 104 and 106 are in substantially the same plane. In a preferred embodiment, electrically isolated metal section 104 is the 5 volt plane and the metal section 106 is the 3.3 volt plane that couples the signal pins 105 to the capacitors 108. The plurality of signal pins 105 are also coupled to the electrically isolated metal section 106.

As is seen in this embodiment, a plurality of capacitors 108 are coupled from the electrically isolated section 104 to the electrically isolated section 106 to provide an alternating current return path. Since the metal sections 104 and 106 are electrically isolated, the number of capacitors 108 required to provide the AC signal return path are substantially reduced. Hence, the number and size of the capacitors 108 required are dictated only by the requirements of a particular standard such as the PCI standard.

Figure 4:
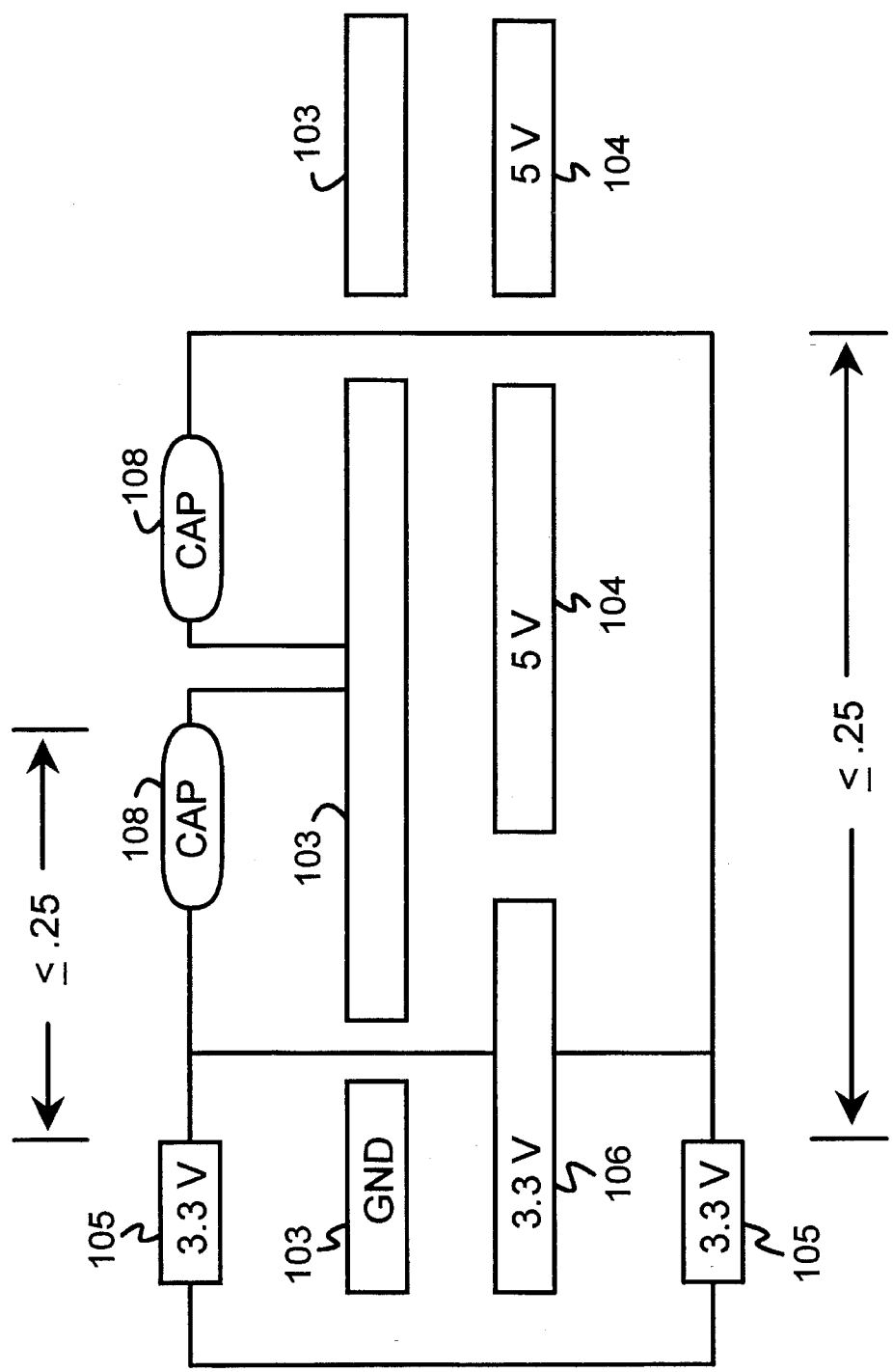
FIG. 4 is a cross-sectional view of the PCB of FIG. 3.

To describe the PCB 100 in more detail, refer now to FIG. 4 which is a cross-sectional view of a portion of the PCB 100. As is seen in the Figure, a 3.3 volt signal pin 105 is provided which is coupled to the capacitors 108.

As is seen, the 3.3 volt metal section 106 is electrically isolated from the 5 volt metal section 104. The signal pins 105 are coupled to the 3.3 volt metal section 106. The capacitors 108 are coupled to the ground layer 103, the 3.3 volt metal section 106 and the signal pins 105. By dividing the metal layer 102 into the two electrically isolated metal sections 104 and 106, additional metal layers are not required for the connection of the capacitors 108.

A PCB 100, in accordance with the present invention, would require four layers for operation of the circuit within the defined parameters. It has been found that the conventional PCB 10 of FIG. 1 would require as many as 6 layers for efficient operation of the circuits associated therewith. These additional layers would significantly add to the cost of the PCB 10.

Hence, the PCB 100 in accordance with the present invention is significantly less expensive and less complex than conventional PCB 10 when utilizing multiple power supply voltages, particularly when the PCB must be compatible with a particular standard, such as the PCI standard.

The present invention has been disclosed in terms of a particular standard, namely the Peripheral Component Interface (PCI) standard. One of ordinary skill in the art will readily recognize, however that a variety of standards could be utilized and their use would be within the spirit and scope of the present invention.

In addition, although the present invention has been described in terms of a 5 volt power supply voltage and a 3.3 power supply voltage, it is readily recognized by one of ordinary skill in the art that a variety of power supply voltages could be utilized and their use would be within the spirit and scope of the present invention. Finally, although in the PCI standard the 3.3 volt power pins must be bussed together to provide the return path, it should be recognized that a variety of different voltage level signal pins could be bussed together to provide the return path and it would be within the spirit and scope of the present invention.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skills in the art without departing from the spirit and scope of present invention, the scope of which is defined solely by the appended claims.

We claim:

1. A printed circuit board (PCB) capable of operating at first and second predetermined voltage levels comprising:

a plurality of metal layers, one of the metal layers being divided to provide two electrically isolated sections, the two electrically isolated sections being on substantially the same plane; one of the electrically isolated sections being associated with the first predetermined voltage level and the other of the electrically isolated sections being associated with the second predetermined voltage level;

a first plurality of signal pins coupled to the one of the electrically isolated sections; and at least one capacitor coupled to a ground plane, the first plurality of signal pins and the one of the electrically isolated metal sections; wherein an alternating current path is provided.

2. The PCB of claim 1 in which the first predetermined voltage is substantially 3 volts.

3. The PCB of claim 1 in which the second predetermined voltage is substantially 5 volts.

4. The method of claim 1 in which the first plurality of signal pins are unused.

5. The method of claim 1 in which the at least one capacitor must average at least 0.01 µf per each of the pins of the first plurality of signal pins.

6. The method of claim 1 in which the at least one capacitor include a trace length to each pin of the first plurality of signal pins which is less than 0.25 inches.

7. In a printed circuit board (PCB) capable of operating at first and second predetermined voltages, the PCB including a plurality of layers, the PCB also including a first and second plurality of signal pins for operation of the first and second predetermined voltages, a method for decoupling the first plurality of signal pins when the PCB is operating at the second predetermined voltage comprising:

dividing one of the plurality of metal layers such that two electrically isolated metal sections are provided on substantially the same plane, one of the electrically isolated metal sections being associated with the first plurality of signal pins; the other of the electrically isolated metal sections being associated with the second plurality of pins; and coupling at least one capacitor to a ground layer, the one of the electrically isolated metal section and the first plurality of signal pins to provide an alternating current return path.

8. The method of claim 7 in which the first predetermined voltage is substantially 3 volts.

9. The method of claim 7 in which the second predetermined voltage is substantially 5 volts.

10. The method of claim 7 in which the first plurality of signal pins are unused when the PCB is operating at the second predetermined voltage.

11. The method of claim 7 in which the at least one capacitor must average at least 0.01 µf per each of the pins of the first plurality of signal pins.

12. The method of claim 7 in which the at least one capacitor include a trace length to each pin of the first plurality of signal pins which is less than 0.25 inches.

13. In a printed circuit board (PCB) capable of operating at first and second predetermined voltages, the PCB including a plurality of layers, the PCB also including a first and second plurality of signal pins for operation of the first and second predetermined voltages, a system for decoupling the first plurality of signal pins when the PCB is operating at the second predetermined voltage comprising:

means for dividing one of the plurality of metal layers such that there is provided two electrically isolated metal sections on substantially the same plane, one of the electrically isolated metal sections being associated with the first plurality of signal pins; the other of the electrically isolated metal sections being associated with the second plurality of pins, and means responsive to the dividing means for coupling at least one capacitor to a ground layer, the one of the electrically isolated metal section and the first plurality of signal pins to provide an alternating current return path.

14. The system of claim 13 in which the first predetermined voltage is substantially 3 volts.

15. The system of claim 13 in which the second predetermined voltage is substantially 5 volts.

16. The system of claim 13 in which the first plurality of signal pins are unused when the PCB is operating at the second predetermined voltage.

17. The system of claim 13 in which the at least one capacitor must average at least 0.01 µf per each of the first plurality of signal pins.

18. The system of claim 13 in which the at least one capacitor include a trace length to each pin of the plurality of the signal pins which is less than 0.25 inches.

19. An expansion board for use in a personal computer, the expansion board being capable of operating at 3.3 volt and 5 volt levels comprising:

a plurality of metal layers, one of the metal layers being divided to provide two electrically isolated sections, the two electrically isolated sections being on substantially the same plane; one of the electrically isolated sections being a 5 volt power supply plane and the other of the electrically isolated sections being a 3.3 volt power supply plane;

a first plurality of signal pins coupled to the 3.3 power supply plane, the first plurality of signal pins being unused when the expansion board is operating at the 5 volt level; and a plurality of capacitors coupled to a ground plane, the first plurality of signal pins and the one of the electrically isolated metal sections, the plurality of capacitors averaging at least 0.01 µF per each of the first plurality of signal pins, each of the plurality of capacitors includes a trace length to each pin of the first plurality of signal pins which is less than 0.25 inches; wherein an alternating current path is provided.

* * * * *